United States Patent
Li Puma et al.

(10) Patent No.: US 8,638,878 B2
(45) Date of Patent: Jan. 28, 2014

(54) METHOD AND FACULTY TO MEASURE AND COMPENSATE DCO FREQUENCY DISTORTIONS USING A DPLL

(75) Inventors: Giuseppe Li Puma, Bochum (DE); Bruno Jechoux, Antibes (FR)

(73) Assignee: Intel Mobile Communications GmbH, Neubiberg (DE)

( * ) Notice: Subject to any disclaimer, the term of this patent is extended or adjusted under 35 U.S.C. 154(b) by 86 days.

(21) Appl. No.: 13/326,712

(22) Filed: Dec. 15, 2011

(65) Prior Publication Data
US 2013/0156129 A1    Jun. 20, 2013

(51) Int. Cl.
*H04L 25/49* (2006.01)

(52) U.S. Cl.
USPC .......................................................... 375/296

(58) Field of Classification Search
USPC .................. 375/285, 295–296; 455/63.1, 501, 455/114.2, 114.3
See application file for complete search history.

(56) References Cited

U.S. PATENT DOCUMENTS

| | | | |
|---|---|---|---|
| 6,101,224 A | 8/2000 | Lindoff et al. | |
| 7,020,070 B2 | 3/2006 | Lindoff | |
| 7,619,487 B2 * | 11/2009 | Schmid | 332/145 |
| 8,009,756 B2 | 8/2011 | Ishikawa et al. | |
| 2005/0129140 A1 | 6/2005 | Robinson | |
| 2009/0207940 A1 | 8/2009 | Staszewski et al. | |
| 2010/0111222 A1 * | 5/2010 | Schimper et al. | 375/296 |
| 2010/0246714 A1 | 9/2010 | Yang et al. | |
| 2012/0057655 A1 * | 3/2012 | Marsili et al. | 375/300 |
| 2012/0177094 A1 * | 7/2012 | Chang et al. | 375/224 |

OTHER PUBLICATIONS

U.S. Appl. No. 13/326,679, filed Dec. 15, 2011.
U.S. Appl. No. 13/326,749, filed Dec. 15, 2011.
Non-Final Office Action dated Nov. 7, 2013 for U.S. Appl. No. 13/326,679. 17 pages.

* cited by examiner

*Primary Examiner* — Khanh C Tran
(74) *Attorney, Agent, or Firm* — Eschweiler & Associates, LLC

(57) ABSTRACT

One embodiment of the present invention relates to a communication system having a digital to analog converter, a first input, a summation component, a compensation filter, and a compensation unit. The converter is configured to receive a first signal. The first input is configured to receive a phase modulation signal. The compensation filter generates a filtered frequency deviation signal to mitigate frequency distortions, such as those from a digital controlled oscillator. The compensation unit includes one or more inputs and is configured to generate a correction signal according to the filtered frequency deviation signal and the first signal. The correction signal at least partially accounts for estimated distortions of the phase modulation signal from the amplitude modulation path and mitigates frequency induced distortions. The summation component is configured to receive the phase modulation signal and the correction signal and to generate a corrected phase modulation signal as a result.

20 Claims, 10 Drawing Sheets

METHOD AND FACULTY TO MEASURE AND COMPENSATE DCO FREQUENCY DISTORTIONS USING A DPLL

BACKGROUND

Power efficiency for transceiver architectures has become an important issue for portable handheld devices. Next generation wireless communication systems, Bluetooth, WLAN, GSM-EDGE, and the like, employ non-constant envelope modulation schemes in order to achieve high data-rates. Traditional designs of RF-modulator concepts employ vector modulator architectures which operate essentially as a single-sideband up-converter (SSB) using two digital-to-analog converters (DAC), two mixers and a linear power amplifier (PA). However, these architectures are power inefficient because they require a complete linear signal path. Further, the vector modulator concept requires a separation of the transceiver and the power amplifier on the mobile printed circuit board (PCB) in order to avoid parasitic coupling of the output signal into the VCO. Therefore the vector modulator transmitter approach has been replaced in some architectures by the polar modulator concept.

The polar modulator concept separates the modulation signal into an amplitude modulation (AM) signal and a phase modulation (PM) signal. The symbols or points used in polar modulation correspond or translate from Cartesian coordinates utilized in vector modulation concepts. The polar modulation concept provides power efficiency advantages, among others. However, the AM path can introduce distortions into the PM path, resulting in data loss, reduced bandwidth, and the like.

DETAILED DESCRIPTION

Figure 1:
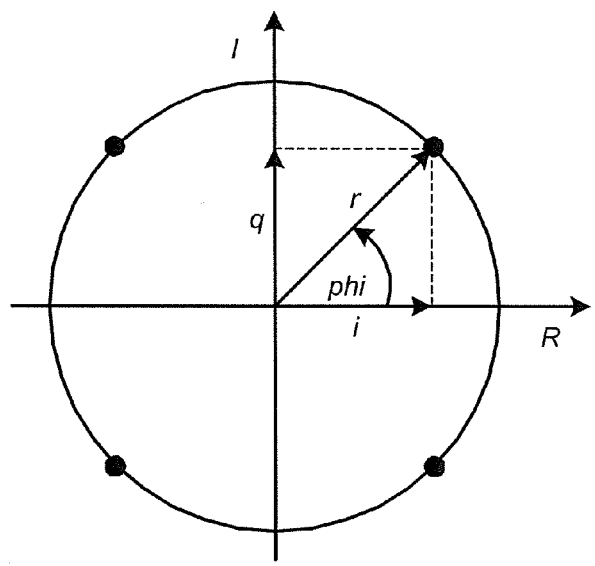
FIG. 1 shows a constellation diagram of a QPSK-signal.

The present invention includes methods and systems to compensate for phase distortions caused by amplitude modulation (AM) to frequency modulation (FM) effects independent of digital phase locked loop (DPLL) filter characteristics. A compensation filter is used to mitigate variations due to a digital controlled oscillator (DCO) of a DPLL. The measurement of phase information can be performed every burst during portions of communication sequences. The measurements can then be utilized to estimate distortion. The estimated distortion can then be utilized to compensate for the AM to FM effects.

One embodiment of the present invention relates to a communication system having a digital to analog converter, a first input, a summation component, a compensation filter, and a compensation unit. The converter is configured to receive an amplitude modulation signal. The first input is configured to receive a phase modulation signal. The compensation filter generates a filtered frequency deviation signal to mitigate frequency distortions, such as those from a digital controlled oscillator. The compensation unit includes one or more inputs and is configured to generate a correction signal according to the filtered frequency deviation signal and the amplitude modulation signal. The correction signal at least partially accounts for estimated distortions of the phase modulation signal from the amplitude modulation path and mitigates frequency induced distortions. The summation component is configured to receive the phase modulation signal and the correction signal and to generate a corrected phase modulation signal as a result. Other embodiments and variations thereof are disclosed below.

The present invention will now be described with reference to the attached drawing figures, wherein like reference numerals are used to refer to like elements throughout, and wherein the illustrated structures and devices are not necessarily drawn to scale.

FIG. 1 shows a constellation diagram of a QPSK-signal. Phase shift keying (PSK) is a digital modulation scheme that conveys data by changing, or modulating, the phase of a reference signal, which is sometimes referred to as a carrier signal. Quadrature phase shift keying (QPSK) is an example of phase shift keying (PSK), which uses four phases.

A convenient way to represent PSK and QPSK is by utilizing a constellation diagram, such as that shown in FIG. 1. The constellation diagram shows the symbols or points in the Argand plane where the real and imaginary axes are termed the in phase and quadrature axes respectively, due to their ninety degrees phase separation.

The symbols are distributed on a circle with a distance of 90 degrees. The geometric location of symbols can be expressed in Cartesian coordinates $i(t)+j \cdot q(t)$ or polar coordinates $r(t)e^{iphase(t)}$. Both expressions are equivalent and can be transformed into each other.

Figure 2:
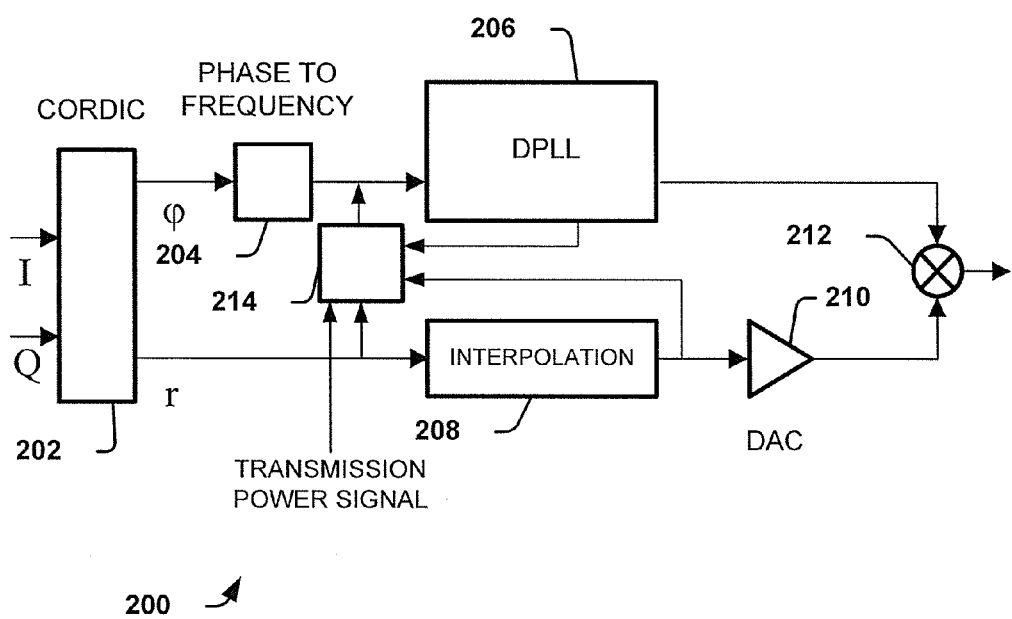
FIG. 2 is a simplified diagram illustrating a communication system employing polar modulation in accordance with an embodiment of the invention.

FIG. 2 is a simplified diagram illustrating a communication system 200 employing polar modulation in accordance with an embodiment of the invention. The system 200 includes a conversion component 202, a phase to frequency converter 204, a digital phase locked loop (DPLL) 206, an interpolation component 208, a digital to analog converter (DAC) 210, a mixer or combiner 212, and a compensation unit 214.

A processor (not shown) is configured to generate orthogonal in-phase (I) and quadrature-phase (Q) symbols or symbol components from a digital signal. The symbol components are also referred to as Cartesian symbol components. The Cartesian symbol components, I and Q, are received by the conversion component 202. The conversion component 202 translates the Cartesian symbol component into an amplitude modulation (AM) symbol components (r) and phase modulation (PM) symbol component (φ). The conversion component can comprise a COordinate Rotation Digital Computer (CORDIC), in one example.

The phase component is provided to the phase to frequency converter 204 followed by the DPLL 206, that perform phase-frequency modulation. The phase to frequency converter 204 converts the phase component signal to a selected frequency. The converted signal is then provided to the DPLL 206. A phase modulated carrier signal, which varies at a first frequency, is then generated by the DPLL 206. The phase modulated carrier signal is provided to the mixer 212.

The amplitude components are received by the interpolation component 208. The interpolation component 208 shifts the amplitude modulation signal, which is a digital signal, to a selected sampling rate. An output of the interpolation component 208 is provided to the digital to analog converter (DAC) 210, which converts the digital signal into an analog signal. An output of the DAC 210 provides the analog signal as an amplitude modulated carrier signal. The amplitude modulated carrier signal is provided to the mixer 212.

The mixer 212 combines the phase modulated carrier signal with the amplitude modulated carrier signal. The signals are combined by modulating the amplitude of the AM carrier signal onto the PM carrier signal, resulting in an output signal. The combined signal can then be transmitted and/or amplified. The mixer 212 can utilize one of many suitable mechanisms to combine the carrier signals. In one example, the mixer 212 is a linear mixer.

The DPLL 206 includes a digital controlled oscillator (DCO). Employing polar modulation, instead of vector modulation, mitigates against parasitic coupling of a power amplifier output signal to the DCO, thereby mitigating the need for shielding chambers between a power amplifier and transceiver on a printed circuit board (PCB).

Shielding may still be needed to mitigate parasitic frequency modulation from the power amplifier (not shown) to the DCO. However, the inventors of the present invention recognize that one way to reduce the need for shielding due to parasitic frequency modulation is to compensate the DCO operation for the parasitic frequency modulation.

To mitigate unwanted errors and distortions, including the parasitic frequency modulation, the compensation component 214 provides a correction signal to the phase modulation path. The correction signal is used to pre-distort the phase modulation signal and mitigate the unwanted errors and distortions, including amplitude modulation to frequency modulation effects. In one example, the correction signal is mixed with the phase modulation signal in order to pre-distort the signal.

The compensation component 214 generates the correction signal from one or more inputs. The inputs include one or more of, samples of the amplitude modulation signal, frequency deviation samples, transmission power values, and the like. In one example, the frequency deviation samples are filtered to account for DCO variations.

Figure 3:
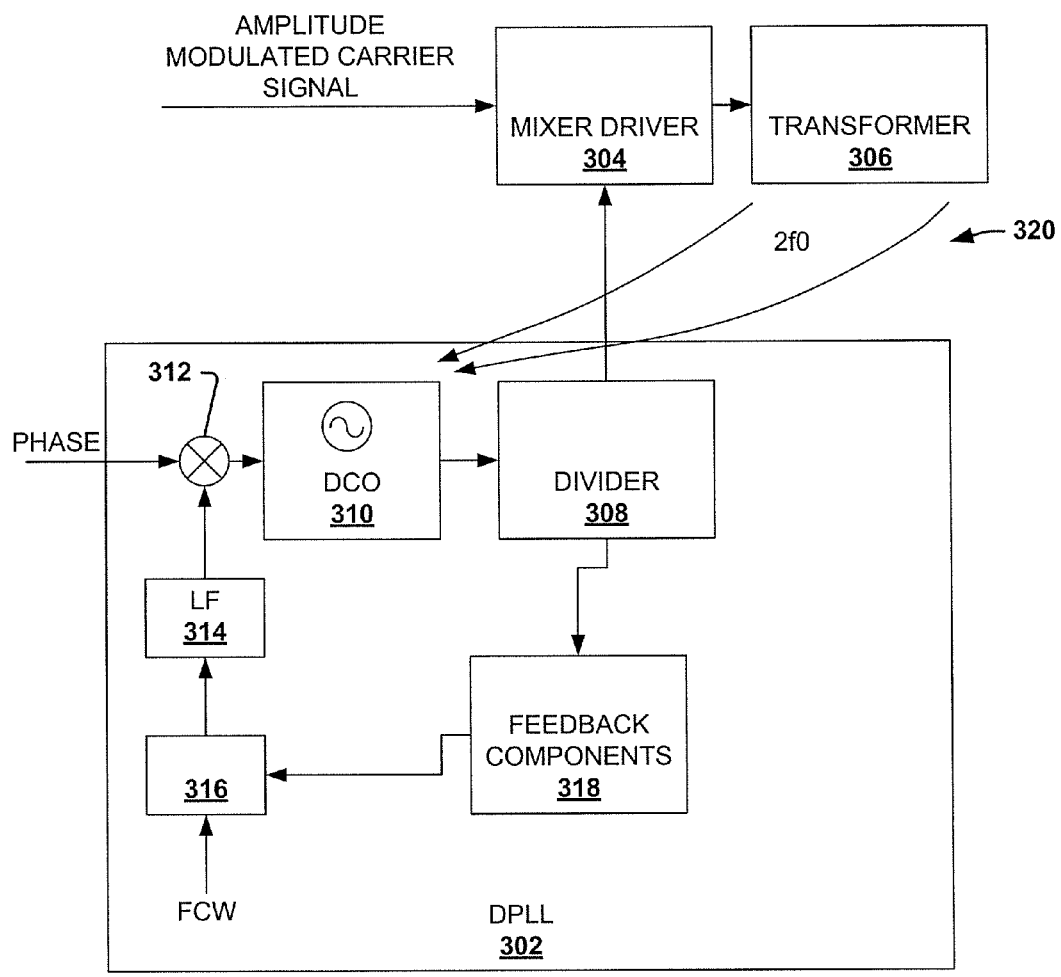
FIG. 3 is a diagram illustrating parasitic coupling of a second harmonic into a DCO for a DPLL of a communication system in accordance with an embodiment of the invention.

FIG. 3 is a diagram illustrating parasitic coupling of a second harmonic into a DCO for a DPLL of a communication system 300. The system 300 includes a DPLL 302, a mixer and driver component 304 and a transformer or coupler 306. The diagram is somewhat simplified in order to more fully illustrate the parasitic coupling.

The mixer and driver component 304 receives an amplitude modulated carrier signal from components not shown and a phase modulated carrier signal from DPLL 302. The transformer or coupler 306 couples the output signal for an antenna (not shown).

The DPLL 302 includes a DCO 310, a divider circuit 308, a mixer 312, a, low pass filter 314, component 316, and feedback components 318. The mixer 312 receives a phase signal and combines it with an output signal from the low pass filter 314. The output signal of the mixer 312 is provided as an input signal to the DCO 310. The component 316 receives a frequency control word (FCW) that selects a frequency for use by the DCO 310. The component 316 can perform other functions as well. An output of the component 316 is provided as an input to the low pass filter 314. The feedback components 318 also provide a feedback signal as an input to the component 316.

The DCO 310 receives the mixer output and provides a phase modulated signal as an output. The output of the DCO is received by the divider 308, which provides the phase modulated carrier signal to the mixer and driver component 304. The divider 308 reduces the frequency of the phase modulated signal by dividing the frequency of the signal by a selected value, such as 2. Another output of the divider 308 provides a second reduced frequency signal to the feedback components 318.

In some communications systems, such as Bluetooth Enhanced Data Rate (BT-EDR) systems, variable envelope modulation is used. Then, the output signal from the mixer and driver component 304 being coupled 320 back to the DCO 310. This coupling 320 generates an unwanted AM to FM conversion, which leads to degradation of the modulation spectrum and increases a differential error vector magnitude. The unwanted conversion is also referred to as a parasitic frequency modulation or second order distortion (H2). The parasitic frequency modulation can be compensated as shown below.

Figure 4:
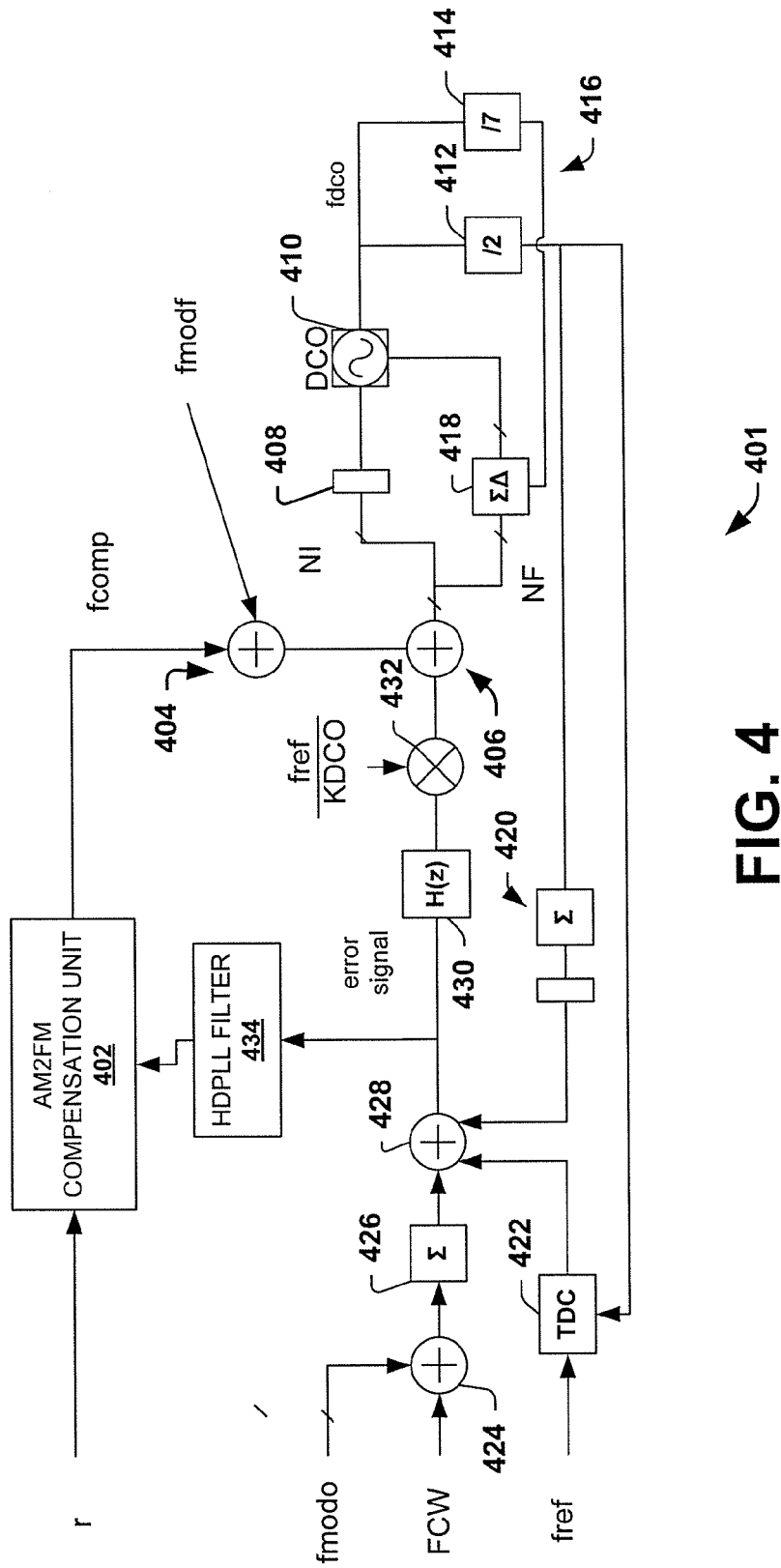
FIG. 4 is a diagram illustrating a DPLL system that includes an amplitude compensation unit and a compensation filter in accordance with an embodiment of the invention.

FIG. 4 is a diagram illustrating a DPLL system 400 that includes an amplitude compensation unit 402 and a compensation filter 434. The system 400 compensates for unwanted amplitude to frequency modulation effects in polar transmitter architectures. The system performs frequency modulation as a two (2) point modulation. The DCO 410 is directly modulated in a feedforward manner by a modulation signal fmod_f. Additionally, a correction input fmod_c is added to a static frequency channel word FCW to correct or mitigate expected phase modulation of the DCO 410.

The system 400 includes the compensation unit 402, a first summation component 404, a second summation component 406, a first component 408, a DCO 410, a first divider 412, a second divider 414, a sigma delta component 418, a sigma component 420, a TDC component 422, a third summation component 424, a second sigma component 426, a fourth summation component 428, a loop filter 430, a compensation filter 434 and a mixer 432.

The compensation unit 402 performs amplitude to frequency compensation according to one or more inputs, including an amplitude modulation signal "r" and a frequency deviation signal, also referred to as an error signal. The compensation unit provides a correction signal, also referred to as a compensated output, "fcomp", or a compensation signal to the first summation component 404. In alternate embodiments of the invention, other signals can be utilized instead of the amplitude modulation signal including, for example, an envelope or envelope signal.

The first summation component 404 receives the correction signal fcomp and the (uncorrected) phase modulation signal fmod_f and provides an output signal there from. The output signal can also be referred to as the corrected phase modulation signal. The second summation component 406 receives the output signal from the first summation component and an output from the mixer 432. The second summation component 406 provides an output that is the sum of its inputs to components 408 and 418. The output signal of the second summation component can also be referred to as the corrected phase modulation signal.

The output of the second summation component 406 is received by component or stage 408, which then passes the signal to the DCO 410. The output of the second summation component 406 is also received by the sigma delta modulator or component 418. The DCO 410 generates a DCO output signal (fdco) based on its input from stage 408 and an output from the delta sigma component 418. The DCO output signal is then received by divider circuits 416, which include a first divider 412 and a second divider 414. The first divider 412 divides the DCO output signal frequency by two (2) and the second divider 414 divides the DCO output signal frequency by seven (7). The output of the second divider 414 is provided to the delta sigma component 481.

The first sigma component 420 or integrator and stage receives an output of the first divider 412 and provides its output to the fourth summation component 428 as a first sigma signal. The TDC 422 component also receives the output of the first divider and provides an output to the fourth summation component 428. The TDC 422 operates on a reference frequency (fref) and an output of divider 412. The TDC is configured to measure a time delay between the phase of the reference frequency (fref) and the phase of the output of divider 412. The output from the TDC is a digital word representing the phase/time error between the reference frequency and the output of the divider 412.

The correction input fmod_c is added to the frequency control word FCW by the third summation component 424. The sum is provided to a second sigma component 426, which provides a second sigma signal to the fourth summation component 428. The fourth summation component 428 adds the TDC output signal to the second sigma signal and subtracts the first sigma signal to provide a phase detector signal as an output. The phase detector signal is also utilized as the error signal and, in one example, takes the form of a digital word.

The frequency deviation signal is also provided to the loop filter 430, which provides its output to the mixer 432. The loop filter 430 filters and processes the frequency deviation signal and provides a frequency control word, which represents an error or variation between an instantaneous operating frequency and a newly desired operating frequency of the DCO 410.

Polar modulation communication systems include an amplitude modulation path and a phase modulation path. The amplitude modulation path generates the amplitude modulation signal and amplitude carrier signal. The phase modulation path generates the phase modulation signal and phase carrier signal. If amplitude and phase modulation paths of a communication system utilizing DPLL 400 were perfectly matched, the transmitted signal is removed from the PLL loop dynamics and the frequency deviation signal, also referred to as the phase detector signal, remains zero (0). However, parasitic coupling of the second harmonic of the carrier signal causes a parasitic modulation of the DCO 410. The DPLL attempts to correct the perceived phase modulation by utilizing the correction input (fmod_c). However, low pass characteristics of the DPLL 400 cause the DPLL 400 to react slowly to perturbations and thus the DPLL 400 achieves only a limited suppression of the parasitic modulation. As a result, the frequency deviation signal (also referred to as a phase detection signal) is used as an error signal by the compensation unit 402 to more effectively compensate for the parasitic modulation.

One or more inputs, including the filtered frequency deviation signal and the amplitude modulation signal r[k], are used by the compensation unit 402 to generate the correction signal. The compensation unit 402 uses one or more suitable approaches to generate the correction signal. In one example, a look up table (not shown) approach is used. The lookup table has 2 stored values per entry, the squared and cubic magnitudes of the amplitude modulation signal, corresponding to an instantaneous address in the lookup table. The error signal is utilized to update addresses in the lookup table. The update of the lookup table is performed at a rate of a phase detector clock rate, which is rate at which the frequency deviation signal is generated. To update the table, first an instantaneous frequency error or variation is determined as a difference of a current frequency deviation value minus a previous frequency deviation value and multiplied by a step size parameter. The values can be provided in the form of the filtered frequency deviation signal. The instantaneous frequency error is used to update the table entry value at the address of r[k-k0], where k0 is the delay between the compensation or correction signal output value fcomp[k-k0] and the current frequency deviation value p[k]. The correction or compensation signal fcomp[k] should also be aligned in time respect to a transmit carrier signal s(t). As a result, the time delay of the compensating signal path should be adjusted to the delay of the envelope signal path.

A suitable approach is utilized to generate the correction signal based on the inputs. In one example, the compensation unit 402 generates a correction signal according to the following formula:

$$f_c(r) = a_2 r^2 + a_3 r^3$$

where r is a current sample of the envelope or amplitude modulation signal, $a_2$ is a first coefficient and $a_3$ is a second coefficient. The first and second coefficient can be derived by performing a least squares estimation during a ramp portion of a communication sequence, as shown infra.

However, it is noted that variations in the DCO and DPLL can introduce variations into an unfiltered frequency deviation signal and reduce the effectiveness of the compensation unit 402. Thus, the correction signal may not be able to account for DPLL characteristics. For example, transfer characteristics for DCO-phase to phase signals may not be accounted for. As a result, it is noted that the compensation filter 434 is utilized so that the transfer characteristics for the DCO remain constant.

The compensation filter 434 filters the frequency deviation signal to generate the filtered frequency deviation signal, as shown below. As a result, the filtered error signal and the envelope signal r[k] (magnitude samples) are used as first and second inputs to generate the correction signal.

The feedback mechanism of the DPLL, the control loop the will react on the phase perturbations resulting to a distorted phase measurement because of the feedback mechanism of the DPLL system 401. The step-response of the DPLL system 400 from the DCO 410 to the phase-detector output provided by the fourth summation component 428 has a high pass transfer function.

$$\frac{\varphi_e(s)}{\varphi_{DCO}(s)} = \frac{1}{1 + G_{OL}(s)} = 1 - H(s).$$

where $\varphi_e(s)$ is the phase detector output or frequency deviation signal, $\varphi_{DCO}(s)$ the feedback, and $G_{OL}(s)$ is the open loop transfer function given by $$G_{OL}(s) = \left(\alpha + \frac{\beta \cdot f_R}{s}\right) \cdot \frac{K_{DCO}}{\hat{K}_{DCO}} \cdot \frac{f_R}{s}$$

where alpha ($\alpha$) is the proportional gain factor of the loop filter 430 and beta ($\beta$) is the integral gain factor of the loop filter. The DCO gain factor $K_{DCO}$ is measured during the locking process and can be estimated with high accuracy. Thus, the loop characteristic of the DPLL 401 is only determined by the loop filter 430 and is almost independent of the DCO gain estimation.

In order to compensate the feedback mechanism of the control loop the phase error signal can be applied to compensation filter 434 such that the distortion transfer characteristic DCO-phase to phase detector output phase signal remains constant.

$$\frac{\varphi_{e,compout}(s)}{\varphi_{DCO}(s)} = \frac{H_{DPLL,comp}(z)}{1 + G_{OL}(s)} = \frac{1 + \hat{G}_{OL}(s)}{1 + G_{OL}(s)} \approx 1$$

The open loop transfer function is known and, therefore, can be approximated by a digital filter and used as the compensation filter 434. The digital filter, $H_{DPLL,comp}$ (s), is then given by the following equation:

$$H_{DPLL,comp}(s) = H_{DIG}(s) \approx 1 + G_{OL}(s)$$

Figure 5:
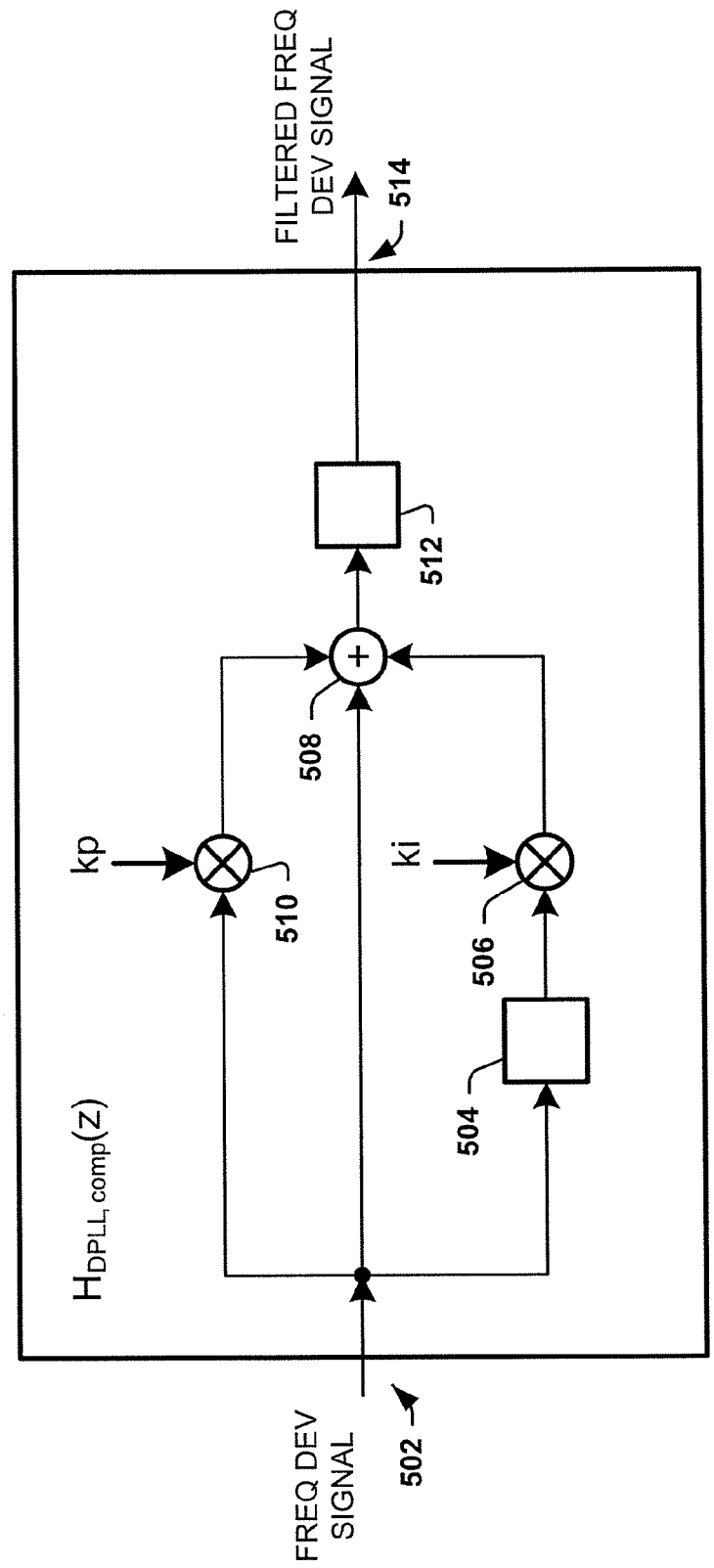
FIG. 5 is a block diagram illustrating a compensation filter in accordance with an embodiment of the invention.

FIG. 5 is a block diagram illustrating a compensation filter 500 in accordance with an embodiment of the invention. The compensation filter 500 can be utilized, for example, in system 401 of FIG. 4B for the compensation filter 434.

The compensation filter 500 receives an error signal, also referred to as a frequency deviation signal, at a first input 502. The frequency deviation signal is received by a first integrator 504. An output of the first integrator and a coefficient ki are mixed by a first mixer 506. A second mixer 510 combines the frequency deviation signal with a second coefficient kp. Outputs of the first mixer 506 and the second mixer 510 are added to the frequency deviation signal by summation component 508. An output of the summation component 508 is provided to a second integrator 512, which outputs a filtered frequency deviation signal at output 514.

It is noted that the compensation filter 500 can be integrated into an AM to FM compensation component or can be a separate component.

Figure 6A:
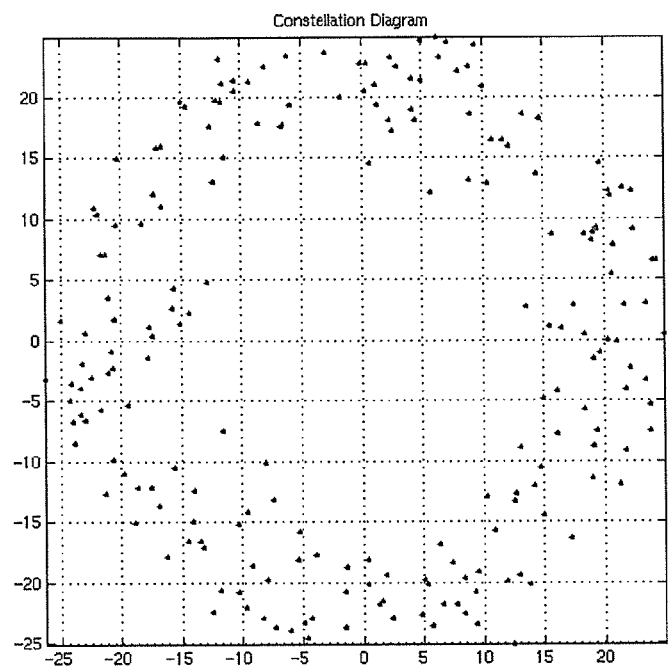
FIGS. 6A and 6B are graphs illustrating an 8PSK constellation diagrams for 4 MHz peak frequency distortion without and with compensation.
Figure 6B:
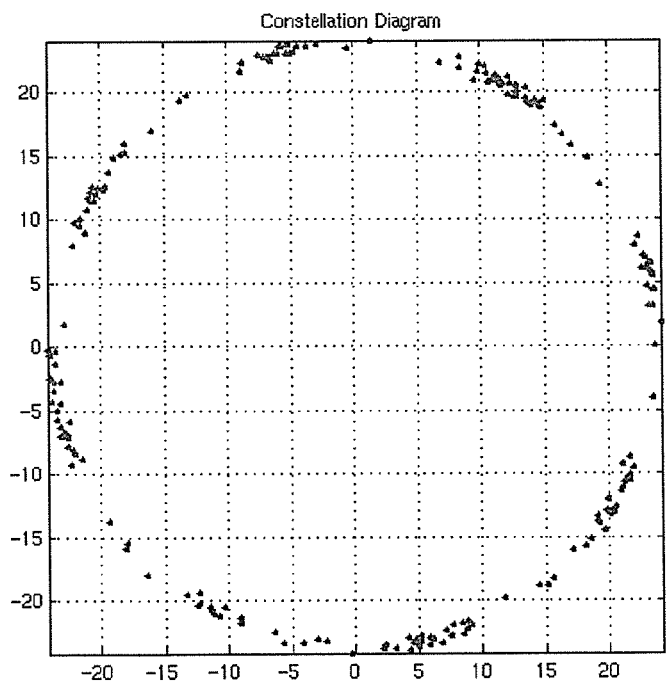

FIGS. 6A and 6B are constellation diagrams illustrating an 8PSK constellation diagram for 4 MHz peak frequency distortion. The diagrams are simulations and provided for illustrative and non-limiting purposes. FIG. 6A depicts the constellation diagram without compensation or correction. FIG. 6B depicts the constellation diagram with compensation or correction as shown above using a compensation unit, such as the compensation unit 402 of FIG. 4 and a compensation filter, such as the compensation filter 434 of FIG. 4. Thus, it can be seen that the constellation diagram with compensation provides for greater uniformity and closer constellation points than without compensation.

Furthermore, differential error vector magnitude (DEVM) values can be determined for created output signals with and without compensation. Without compensation, a DEVM root mean square value of 21, a DEVM peak value of 53, and a DEVM 99 value of 30 are obtained. With compensation as shown above using a compensation unit and a compensation filter, a DEVM root mean square value of 5.5, a DEVM peak value of 16, and a DEVM 99 value of 13 are obtained. Thus, it can be seen that the compensation shown above results in reduction of the DEVM values.

Figure 7:
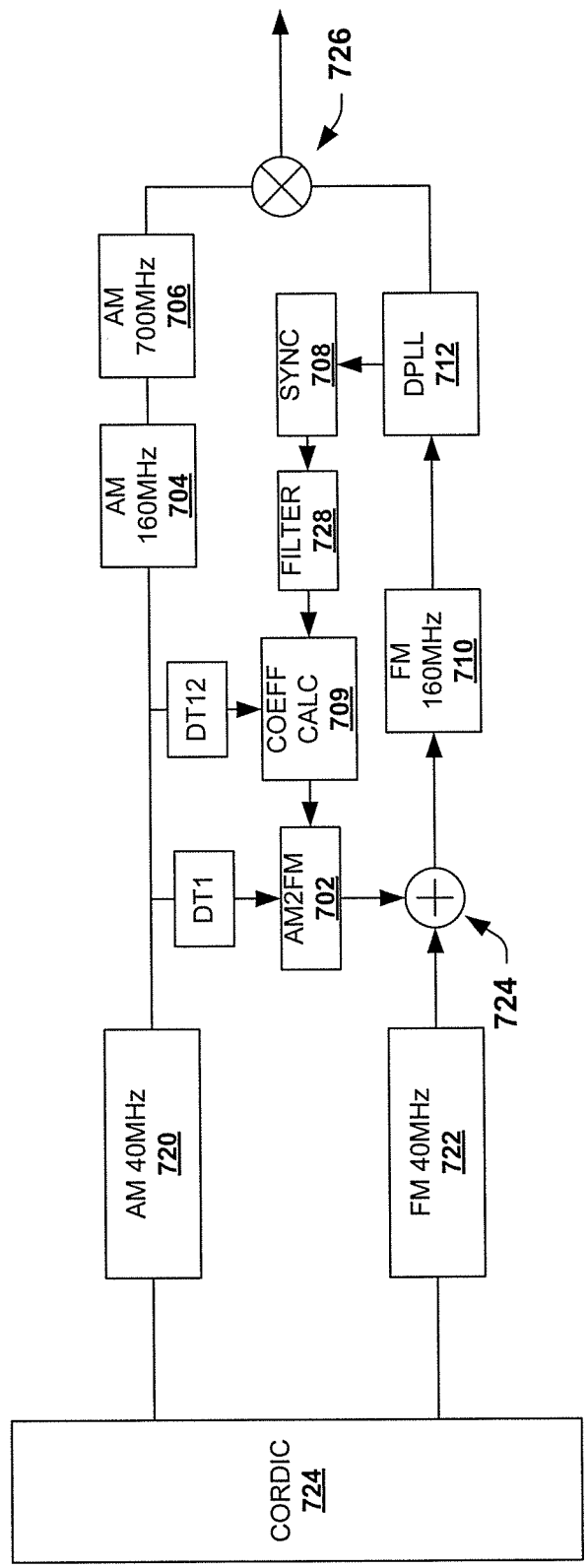
FIG. 7 is a block diagram illustrating a communication system in accordance with an embodiment of the invention.

FIG. 7 is a block diagram illustrating a communication system 700 in accordance with an embodiment of the invention. The system 700 includes a compensation component that provides a correction signal to a phase modulation path in order to compensate for unwanted distortions or errors, including unwanted frequency shift. The compensation component also mitigates distortions produced by a digital controlled oscillator of a DPLL 712.

The system 700 includes a conversion component 724 that receives symbol components, such as Cartesian symbol components and translates the received symbol components into phase and amplitude components. The phase component is provided to frequency modulation component 722 and the amplitude component is provided to amplitude modulation component 720.

The amplitude modulation component 720 generates or modulates an amplitude signal from the amplitude component at a selected frequency. The amplitude modulation component 720 operates at a suitable frequency, such as 40 MHz, to generate the amplitude signal. A second amplitude modulation component 704 modulates the amplitude signal to a higher frequency. In one example, the higher frequency is 160 MHz. A third amplitude modulation component 706 modulates the amplitude signal to a carrier frequency. In one example, the carrier frequency is 700 MHz. The amplitude signal is then provided to mixer 726.

The phase components are received by a phase to frequency converter 722, which converts the phase components to a selected frequency as a phase signal. In one example, the selected frequency is 40 MHz. The phase signal is added to a correction signal at summation component 724. As stated above, the correction signal at least partially compensates for distortions or errors, including unwanted frequency shifts. The phase signal is converted to a higher frequency at modulation component 310. In one example, the higher frequency is 160 MHz. The phase signal is provided to DPLL 712 whose output represents a phase modulated carrier signal. The phase modulated carrier signal is provided to the mixer 726, where it is combined with the amplitude modulated carrier signal and provided as an output signal. The output signal can be further amplified, transmitted, and the like.

The DPLL 712 also provides a frequency deviation signal, also referred to as a phase differential signal, to a synch component 708. An output of the synch component 708 is provided to the filter 728 and then to a coefficient calculation component 709. Further, an amplitude signal corresponding to the output of component 720 and delayed by DT12 is also provided to the coefficient calculation component 709. The DT12 delay compensates for delays between component 720 output and the filter 728 output and facilitates time alignment between the frequency deviation signal (measured frequency error) and the amplitude signal generating the distortion.

The compensation filter 728 receives the frequency deviation signal from the sync component 708 and filters away variations due to a filtering effect of the DPLL 712. As a result, a filtered frequency deviation signal is provided by the compensation filter 728 that mitigates DPLL variations on the generation of the correction signal. The coefficient calculation component 709 generates or calculates characterization coefficients, which are provided as an output from the amplitude signal delayed by DT12 and the filtered frequency deviation signal.

At least a second signal made of the amplitude signal from component 720 delayed by DT1, is provided to the compensation component 702. The delay DT1 compensates for delays between the amplitude modulation path and the phase modulation path and facilitates time alignment. The amplitude compensation component 702, also referred to as an AM to FM compensation component, generates the correction signal according to the amplitude signal delayed by DT1, the characterization coefficients, and, possibly, one or more additional inputs.

The compensation component 702 is configured to operate with two phases, an estimation phase and a pre-distortion phase. During the estimation phase, the compensation component 702 or the coefficient calculation component 709 utilizes a magnitude ramp portion of a frame and instantaneous frequency deviation values to estimate distortions of the phase modulation path, including amplitude modulation to frequency modulation effects and second order distortion effects. The magnitude ramp is present during certain types of frame configurations, such as GFSK modulation. The instantaneous frequency deviation values or samples are provided in the form of the frequency deviation signal or the filtered frequency deviation signal. The distortion effect results from frame transmission conditions including, but not limited to, frequency channel, max power, temperature, chip process, and the like. The compensation component 702 utilizes the estimated distortion to pre-distort the phase modulation signal by providing the correction signal to the summation component 724. It is also noted that the time delay of the frequency correction signal should be adjusted to a delay of the envelope signal path so that the frequency correction signal is aligned in time respect to the output signal provided at the mixer 726.

In one example, the estimated distortion is calculated for each frame. However, the inventors of the present invention recognize that a training or ramp portion of subsequent frames may be substantially similar to a current or previous frame. Thus, in another example, the estimated distortion is reused for a period of time or a selected number of frames to mitigate power consumptions and computation.

It is also noted that Fig. shows the compensation unit 702, the coefficient calculation component 709 and the compensation filler 728 as separate components. However, it is appreciated that any or all of these can be combined into a single compensation unit.

Figure 8:
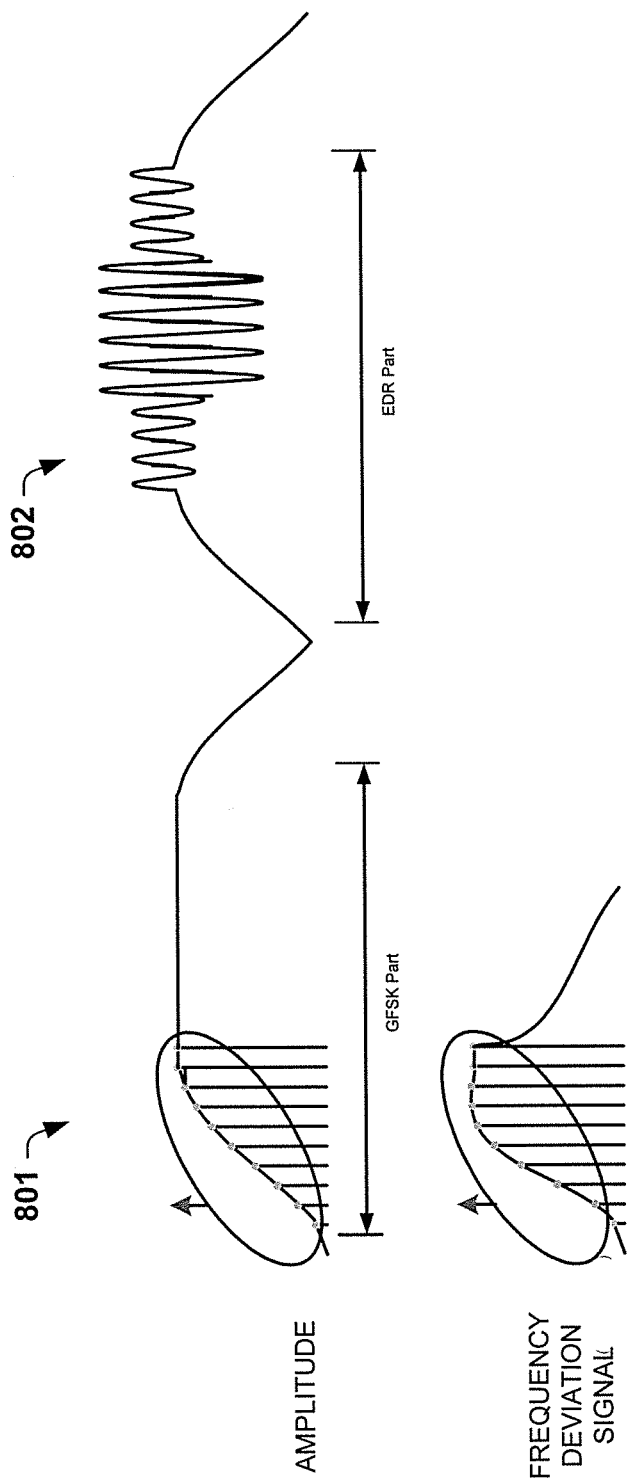
FIG. 8 is a graph showing an example of frame that can be utilized to mitigate unwanted error or distortions.

FIG. 8 is a graph showing an example of frame that can be utilized to mitigate unwanted error or distortions. The example frame shown is an enhanced data rate (EDR) frame according to the Bluetooth standard. The frame includes a training or ramp portion 801 and a data portion 802. The ramp portion 801 is a GFSK ramp in this example. The data portion 802 is an EDR portion. Additionally, the graph shows the instantaneous frequency deviation values 803. It can be seen that the ramp portion includes a sweep of magnitude values.

Figure 9:
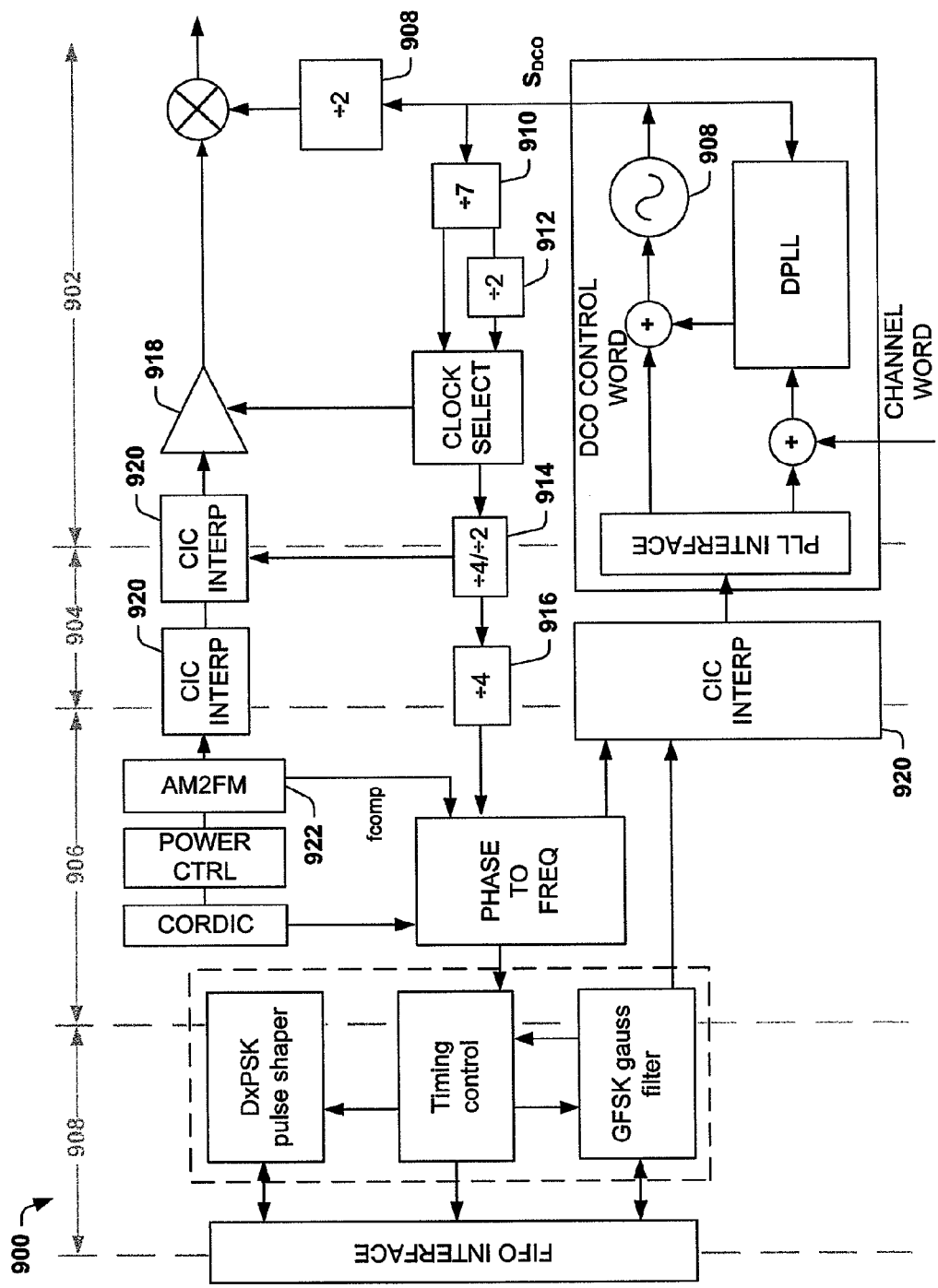
FIG. 9 is a diagram illustrating a Bluetooth polar transmitter as provided in accordance with an embodiment of the invention.

FIG. 9 is a diagram illustrating a Bluetooth polar transmitter 900 as provided in accordance with an embodiment of the invention. The transmitter 900 includes a compensation component 922 to mitigate unwanted errors and distortions from the amplitude modulation path. FIG. 9 illustrates a polar transmitter having a plurality of frequency dividers configured to generate three different "frequency regions", wherein the transmitter operations performed in each of the frequency regions are dependent upon a reduction of a DCO frequency equal to twice the Bluetooth operating frequency (e.g., 4804 to 4960 MHz). It will be appreciated that FIG. 9 illustrates a simplified example of a divider configuration that may be used to generate a number of frequency regions and is not intended as a limiting example.

In a first region 902, the frequency of the output signal $S_{DCO}$ from DCO 908 is divided by frequency dividers 910 to generate operating frequencies of 686 MHz-708 MHz or collectively by divider 910 and 912 to generate operating frequencies of 343 MHz-354 MHz. The frequencies in the first region 902 are used to generate a clock signal that drives sampling of DAC 918 to generate an analog amplitude modulated signal having a desired frequency.

In a second region 904, the frequency of the output signal $S_{DCO}$ from DCO 908 is further divided by divider 914 to generate an operating frequency of 171 MHz-177 MHz for certain digital operations. As shown in FIG. 9, a further integer division by 4 (or 2 depending on the selective use of dividers 910 and 912) generates an signal for digital operations in both the amplitude and modulation path. These digital operations may comprise CIC interpolation of the AM signal and/or PM signal(s) by interpolator(s) 920.

In a third region 906, the frequency of the output signal $S_{DCO}$ from DCO 908 is further divided by divider 916 to generate an operating frequency of 42 MHz-44 MHz. As shown in FIG. 9, a further integer division by 4 generates a signal for other operations in the digital part of the polar transmitter such as the CORDIC and pulse shaping filter respectively.

A further divider (not shown) may be used to divide the 42 MHz-44 MHz signal down to 10-11 MHz clock signal for use in a fourth region 908. The 10-11 MHz clock signal may be used in digital operation of additional components such as the DxPSK pulse shaper and/or timing control, etc.

The compensation unit 922 operates in the third region to mitigate unwanted phase signal errors and distortions resulting from the amplitude modulation path. The compensation unit 922 derives an estimate of phase modulation distortions, including amplitude modulation to frequency modulation effects. The estimate is derived at least partly from ramp values and filtered frequency deviation values during a ramp portion of a communication sequence. The frequency deviation values are filtered to mitigate introducing variations from the DPLL. During data portion(s) of the communication sequence, the compensation component 922 utilizes the estimate to pre-distort the phase modulation signal to mitigate for the unwanted errors and distortions.

Figure 10:
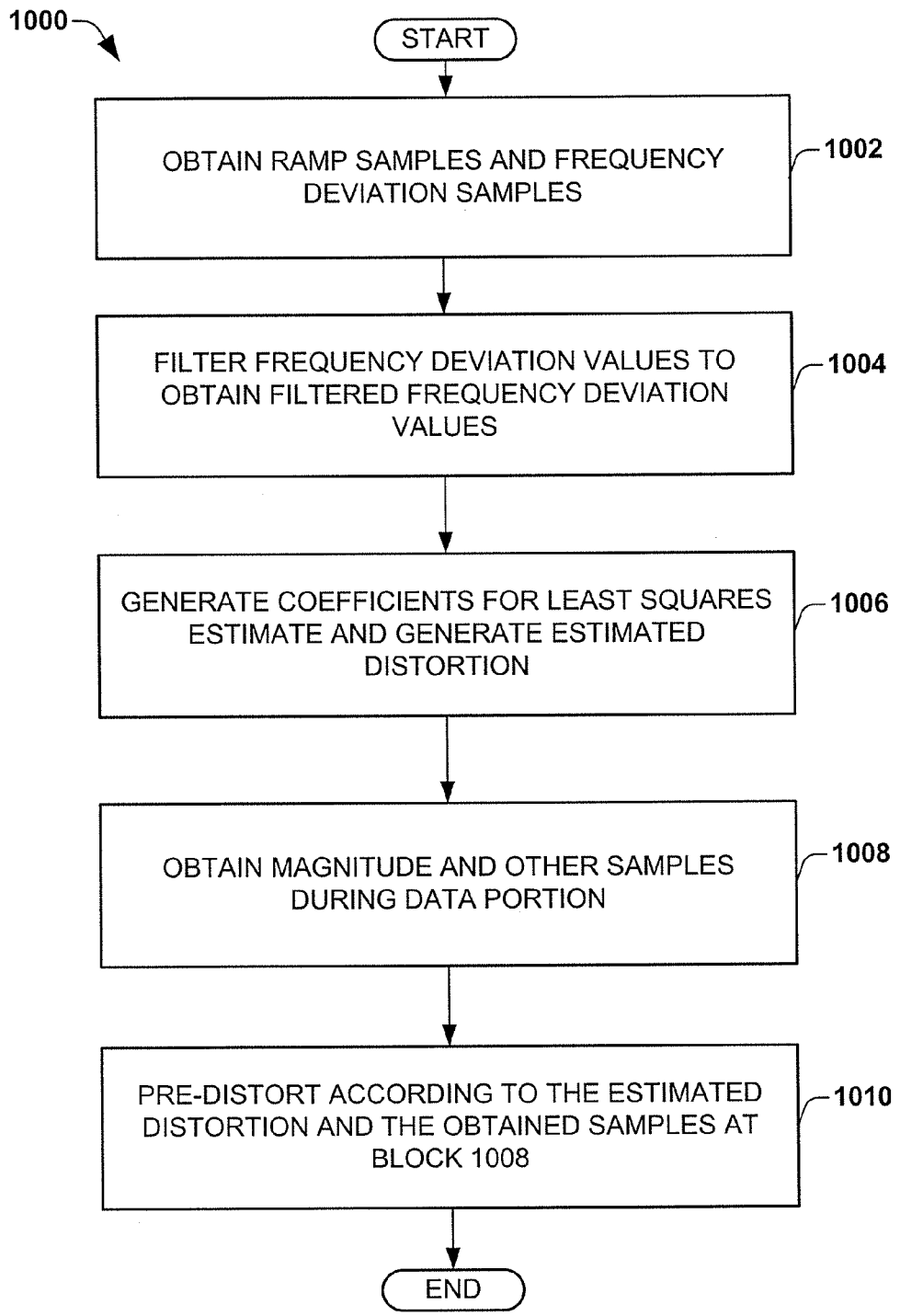
FIG. 10 is a flow diagram illustrating a method to mitigate phase and frequency distortions resulting from an amplitude modulation signal.

FIG. 10 is a flow diagram illustrating a method 1000 to mitigate phase modulation distortions, including those resulting from an amplitude modulation signal. The method 1000 utilizes a ramp or training portion of a communication sequence to generate an estimated distortion. Then, during a data portion, the estimated distortion is utilized with other inputs or signals to correct or pre-distort a signal to at least partially account and mitigate the estimated or actual distortion.

The method begins at block 1002, where ramp samples of an amplitude modulation signal and frequency deviation values for a ramp portion of a communication sequence are obtained. The communication sequence includes an amplitude ramp portion as a training sequence and a data portion. In one example, a data packet according to the Bluetooth standard comprises the communication sequence. In this example, the ramp portion is a training portion or GFSK ramp, which includes an amplitude signal that sweeps from zero to a maximum value. FIG. 8 shows an example of ramp portions 801 and data portions 802 of a communication sequence.

The frequency deviation values can be obtained from a DPLL component, such as those shown above. The frequency deviation values are instantaneous sampled values obtained by differentiation of DPLL phase comparator samples.

Frequency deviation values are filtered at block 1004 to remove variations from the DPLL component, including the DCO, and to provide filtered frequency deviation values. The filtered frequency deviation values are devoid of the unwanted variations. A digital filter that provides the filter characteristics show above can be employed.

Compensation coefficients are generated during an estimation phase at block 1006 according to the frequency deviation values and the ramp samples. The compensation coefficients are used to generation a distortion estimate. An order 2 and 3 polynomial least square fitting of the frequency deviation versus the magnitude is performed. The distortion estimate is representative of linear or non-linear distortion from an amplitude modulation path.

Magnitude samples of the amplitude modulation signal are obtained during a data portion of the communication sequence at block 1008. Other samples and/or signals can also be obtained during the data portion including frequency deviation samples, transmission power samples, and the like.

The estimated distortion or loop effect is utilized during a pre-distortion phase to pre-distort a phase modulation signal according to the magnitude samples at block 1010. The pre-distortion can be accomplished by generating a phase correction signal, also referred to as a correction signal, and combining it with the phase modulation signal.

While the above method 1000 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

The following discussion illustrates a mechanism to generate a distortion estimate.

Magnitude ramp samples, noted as $m_1$ to $m_N$ hereafter, and instantaneous frequency deviation samples, noted as $y_1$ to $y_N$ hereafter, are obtained as shown above. The ramp samples and frequency deviation samples are obtained during the ramp or training portion of a frame. In one example, 26 ramp and frequency deviation samples are obtained for a 1 microsecond ramp sampled at 26 MHz. In another example, 75 ramp and frequency deviation samples are obtained for a 3 micro second ramp. A large number of samples, such as greater than 26, mitigates phase noise effects. An order 2 and 3 polynomial least square fitting of the frequency deviation samples versus the magnitude ramp samples is performed. The fitting aims at determining an optimum or suitable value for $a_2$ and $a_3$, second and third order coefficients of the polynomial. It is noted that the present invention contemplates other polynomial fittings beyond the specific $2^{nd}$ and $3^{rd}$ order fitting described.

The estimation is performed over N samples where Y is a vector representing the frequency deviation samples $y_1$ to $y_N$ and M is an array representing the ramp samples $m_1$ to $m_N$. A is a coefficient vector representing the $2^{nd}$ and $3^{rd}$ order coefficients, $a_2$ and $a_3$.

$$Y = MA$$

$$\begin{bmatrix} y_1 \\ y_2 \\ \vdots \\ y_N \end{bmatrix} = \begin{bmatrix} m_1^2 & m_1^3 \\ m_2^2 & m_2^3 \\ \vdots & \vdots \\ m_N^2 & m_N \end{bmatrix} \begin{bmatrix} a_2 \\ a_3 \end{bmatrix}$$

The least squares estimate of the coefficients vector A is equal to:

$$\hat{A} = (M^T M)^{-1} M^T Y = HY$$

Once the $2^{nd}$ and $3^{rd}$ order coefficients, $a_2$ and $a_3$ have been obtained, the H2 effect can be estimated and compensation can be applied to a remaining portion of the communication, such as the rest of the frame. The corrected phase modulation signal, denoted as $y_{corrected}$, can be obtained from the following equation where y represents a phase modulation signal (uncorrected).

$$y_{corrected} = y - [m^2 \, m^3] \hat{A}$$

The above calculations involve a fair number of arithmetic operations. The calculation complexity of M is on the order of O(2N). The calculation complexity of H is on the order of (8N+8). The calculation complexity of W is on the order of (2N). The total calculation complexity is on the order of (12N+8). The complexity can be reduced by utilizing pre-calculated values stored. For example, the M and H matrices can be pre-calculated using the known ramp shape and stored in the lookup table. The pre-calculated H matrix can then be utilized to estimate the H2 coefficients, $a_2$ and $a_3$ by a single matrix/vector multiplication. This results in a complexity reduction from O(12N+8) down to O(2N).

Figure 11:
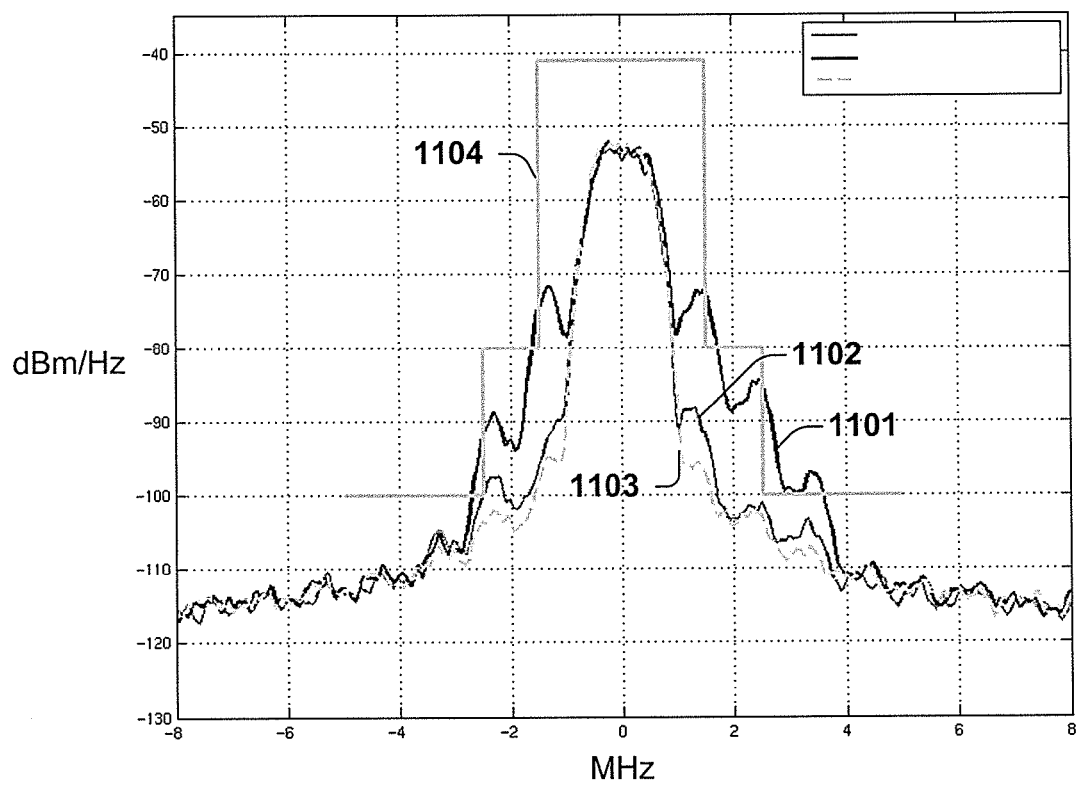
FIG. 11 is a graph illustrating transmission spectrums obtained by various mechanisms.

FIG. 11 is a graph illustrating the impact of utilizing a correction signal on a transmission spectrum. The graph depicts MHz on an x-axis and dB/Mhz on a y-axis. The graph depicts transmissions across a spectrum utilizing a 12 dB gain.

Line 1102 depicts a transmission spectrum with filtered compensation by a correction signal as shown above. Line 1101 depicts a transmission spectrum without compensation. Line 1103 depicts an ideal transmission spectrum devoid of distortions. Line 1104 shows channel regions for adjacent channels of the transmission spectrum.

It can be seen that line 1101 exceeds the bounds of the channel regions in several locations. As a result, data integrity and/or transmission bandwidth can be degraded. Line 1103, the ideal transmission, does not contain any distortions and thus, falls within the bounds of the channel regions. However, line 1103 is not attainable in real world situations. Line 1102 is obtained using the filtered frequency deviation values and correction signal as shown above. Line 1102 does appear to deviate from the ideal, however it remains within the channel regions defined by 1104 and shows a visual and substantial improvement over line 1101.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A communication system comprising:
   a digital to analog converter configured to receive a first signal;
   a compensation filter configured to generate a filtered frequency deviation signal from a frequency deviation signal to mitigate frequency distortions from a digital controlled oscillator;
   a compensation unit having one or more inputs, the compensation unit configured to obtain amplitude samples of the first signal at a first input of the one or more inputs, and obtain the filtered frequency deviation signal at a second input of the one or more inputs, and generate a correction signal according to the one or more inputs, wherein the correction signal accounts for distortions from a modulation path; and
   a summation component configured to receive a phase modulation signal and the correction signal and to generate a corrected phase modulation signal there from.

2. The system of claim 1, further comprising a digital phase locked loop circuit comprising the digital controlled oscillator and configured to generate a carrier phase modulation signal from the corrected phase modulation signal.

3. The system of claim 2, wherein the digital phase locked loop circuit is further configured to provide the frequency deviation signal to the compensation filter.

4. The system of claim 3, wherein the frequency deviation signal represents an instantaneous frequency deviation of the phase modulation signal.

5. The system of claim 3, wherein the compensation component is configured to receive a transmission power signal at a third input of the one or more inputs, and the compensation component scales the correction signal according to the transmission power.

6. The system of claim 1, wherein the first signal is an amplitude modulation signal, the amplitude modulation signal and the phase modulation signal are of a communication sequence having a first portion and a second portion, wherein the compensation component is configured to develop an amplitude distortion estimate during a first portion of communication sequence and utilizes the distortion estimate during a second portion of the communication sequence to generate the correction signal.

7. The system of claim 6, wherein the first portion is a magnitude ramping portion and the second portion is a data transfer portion.

8. The system of claim 6, wherein the compensation component is configured to utilize a least squares estimation to develop the amplitude distortion estimate.

9. The system of claim 1, wherein the compensation filter is a digital filter.

10. The system of claim 1, wherein the compensation filter filters the frequency deviation signal to generate the filtered frequency deviation signal.

11. The system of claim 1, wherein the compensation filter filters the frequency deviation signal according to a proportional gain factor of a loop filter and an integral gain factor of the loop filter.

12. The system of claim 1, wherein the compensation component includes a coefficient calculation component configured to develop second and third order coefficients utilized by the compensation component to develop the amplitude distortion estimate.

13. A communication system comprising:
    a converter configured to provide a phase components signal and an amplitude components signal;
    an interpolation component configured to generate an amplitude modulation signal from the amplitude components signal;
    a digital to analog converter configured to generate an amplitude carrier modulation signal from the amplitude modulation signal;
    a phase to frequency converter configured to generate a phase modulation signal from the phase components signal;
    a frequency deviation component configured to generate a frequency deviation signal that represents instantaneous deviations in frequency of the phase modulation signal;
    a compensation filter that generates a filtered frequency deviation signal from the frequency deviation signal, wherein the filtered frequency deviation signal mitigates frequency induced distortions;
    a compensation unit having one or more inputs, the configured to receive one or more input signals and generate a correction signal according to the one or more input signals, wherein the one or more input signals include amplitude samples of the amplitude modulation signal and the filtered frequency deviation signal and wherein the correction signal accounts for distortions from the amplitude modulation signal;
    a summation component configured to receive the phase modulation signal and the correction signal and to generate a corrected phase modulation signal there from;
    a digital phase locked loop configured to receive the corrected phase modulation signal and to generate a phase carrier modulation signal; and
    a mixer to mix the phase carrier modulation signal and the amplitude carrier modulation signal into an output transmit signal.

14. The system of claim 13, wherein the digital phase locked loop introduces the frequency induced distortions into the phase modulation signal.

15. The system of claim 14, wherein the compensation filter filters the frequency deviation signal according to an open loop transfer function of a loop filter.

16. The system of claim 13, further comprising a coefficient estimator that generates coefficients based on ramp samples of the amplitude modulation signal and frequency deviation samples of the phase modulation signal.

17. The system of claim 16, wherein the coefficients are provided as a second input to the one or more inputs of the compensation unit.

18. A method of estimating distortion in a communication system, the method comprising:
    obtaining ramp samples of a training portion of a communication sequence;
    obtaining frequency deviation samples of the training portion of the communication sequence;
    generating filtered frequency deviation samples from the frequency deviation samples;
    developing a distortion estimate according to the ramp samples and the filtered frequency deviation samples, wherein the distortion estimate estimates phase distortion resulting from an amplitude modulation path; and
    generating a correction signal according to the distortion estimate and magnitude samples of a data portion of the communication sequence.

19. The method of claim 18, further comprising applying the correction signal to the communication sequence to mitigate frequency distortions.

20. The method of claim 19, wherein generating the filtered frequency deviation samples comprises filtering the frequency deviation signal according to a reference frequency and a plurality of gain factors of a loop filter.

\* \* \* \* \*